United States Patent
Cai et al.

(10) Patent No.: US 10,637,271 B2
(45) Date of Patent: Apr. 28, 2020

(54) ADAPTIVE CHARGE VOLTAGE MANAGEMENT FOR LITHIUM ION AND HYBRID CAPACITORS

(71) Applicant: AgigA Tech, San Diego, CA (US)

(72) Inventors: Ying Cai, Sichuan (CN); Ronald Sartore, Valley Center, CA (US)

(73) Assignee: AgigA Tech, San Diego, CA (US)

( * ) Notice: Subject to any disclaimer, the term of this patent is extended or adjusted under 35 U.S.C. 154(b) by 0 days.

(21) Appl. No.: 16/147,848

(22) Filed: Sep. 30, 2018

(65) Prior Publication Data
US 2020/0106283 A1    Apr. 2, 2020

(51) Int. Cl.
H02J 7/00       (2006.01)
H02J 7/34       (2006.01)
G11C 5/14       (2006.01)
G11C 14/00      (2006.01)

(52) U.S. Cl.
CPC ............ *H02J 7/0091* (2013.01); *G11C 5/141* (2013.01); *G11C 14/0018* (2013.01); *H02J 7/345* (2013.01)

(58) Field of Classification Search
USPC ........................................ 320/167
See application file for complete search history.

(56) References Cited

U.S. PATENT DOCUMENTS

2007/0103122 A1*  5/2007  Morong ............... G05F 1/46
                                           323/205
2019/0173108 A1*  6/2019  Kitamoto ......... H01M 8/04126

* cited by examiner

*Primary Examiner* — Bryce M Aisaka

(57) ABSTRACT

Disclosed herein are systems and techniques for adaptive capacitor charge voltage management, particularly for lithium-ion capacitors and hybrid capacitors. The techniques adapt the capacitor charge voltage and hence the capacitor stored energy based on capacitor operating temperature and one or more of the capacitance and the equivalent series resistance (ESR) of the capacitor.

10 Claims, 6 Drawing Sheets

Charging Table (example)

| Measured C (aging effect) | Temp Range (Degrees C) | | | | | |
|---|---|---|---|---|---|---|
| | 0 - 5 | 5 - 10 | 10-15 | 15 - 20 | 20 - 35 | above 35 |
| 100% | V +5% | V +4% | V +3% | V +1.5% | V | V - 2% |
| 95% | V +6% | V +4% | V +3% | V +2% | V | V - 2% |
| 90% | V +7% | V +5% | V +4% | V +2.5% | V | V - 1% |
| 85% | V +8% | V +5% | V +4% | V +3% | V | V - 1% |
| 80% | V +9% | V +6% | V +5% | V +4% | V | V - 0.5% |
| 75% | V +10% | V +7% | V +5% | V +4% | V | V - 0.5% |

FIG. 5

Charging Table (example)

| Measured ESR (aging effect) | Temp Range (Degrees C) | | | | | |
|---|---|---|---|---|---|---|
| | 0 - 5 | 5 - 10 | 10-15 | 15 - 20 | 20 - 35 | above 35 |
| 100% | V +2.5% | V +1.5% | V +1% | V +0.5% | V | V − 1.5% |
| 120% | V +3% | V +2% | V +1.5% | V +1% | V | V − 1.5% |
| 140% | V +3.5% | V +2.5% | V +2% | V +1.5% | V | V − 1% |
| 160% | V +4% | V +3% | V +2.5% | V +2% | V | V − 1% |
| 180% | V +4.5% | V +3.5% | V +3% | V +2.5% | V | V − 0.5% |
| 200% | V +5% | V +4% | V +3.5% | V +3% | V | V − 0.5% |

FIG. 6

ADAPTIVE CHARGE VOLTAGE MANAGEMENT FOR LITHIUM ION AND HYBRID CAPACITORS

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 5 illustrates a temperature-associative voltage control structure 500 in accordance with one embodiment.

FIG. 6 illustrates a temperature-associative voltage control structure 600 in accordance with one embodiment.

DETAILED DESCRIPTION

"Control structure" refers to a machine memory region configured such that values or ranges of values corresponding to measurements from sensors, transducers, or clocks are associated with control settings for the voltage on a capacitor.

"Hybrid capacitor" refers to a power source that has characteristics of both a capacitor and a battery.

"Lithium-ion capacitor" refers to a type of capacitor that typically utilizes activated carbon as the cathode. The anode typically utilizes a carbon material which is pre-doped with lithium ions. This pre-doping process lowers the potential of the anode and allows a relatively high output voltage compared with other supercapacitors.

"In-system test" refers to a test performed within a host system on components of the system, as opposed to tests utilizing external automated test equipment.

"Supercapacitor" refers to a capacitor with capacitance values much higher than conventional capacitors (but lower voltage limits) that bridge the gap between electrolytic capacitors and rechargeable batteries. They typically store 10 to 100 times more energy per unit volume or mass than electrolytic capacitors, can accept and deliver charge much faster than batteries, and tolerate many more charge and discharge cycles than rechargeable batteries.

Terminology used herein should be accorded its ordinary meaning in the arts, unless another meaning is defined or indicated by context.

Disclosed herein are systems and techniques for adaptive capacitor charge voltage management, particularly for lithium-ion capacitors and hybrid capacitors. The techniques adapt the capacitor charge voltage and hence the capacitor stored energy based on capacitor operating temperature and one or more of the capacitance and the equivalent series resistance (ESR) of the capacitor.

A fast control loop is utilized to adapt the capacitor charge voltage with changes in capacitor operating temperature, and a slow control loop (slow, relative to the monitoring rate for the fast control loop) is used to adapt the capacitor charge voltage with changes in the capacitance and/or equivalent series resistance. One or more capacitors of a capacitive power supply are charged to a minimum safe enablement voltage to carry out a potential power function they may be needed for if primary power to device components fails, and the fast and slow control loops adjust the capacitor charge voltage adaptively as the capacitor operating temperature changes and also as one or more of the capacitance and ESR change during operation of the device.

Figure 1:
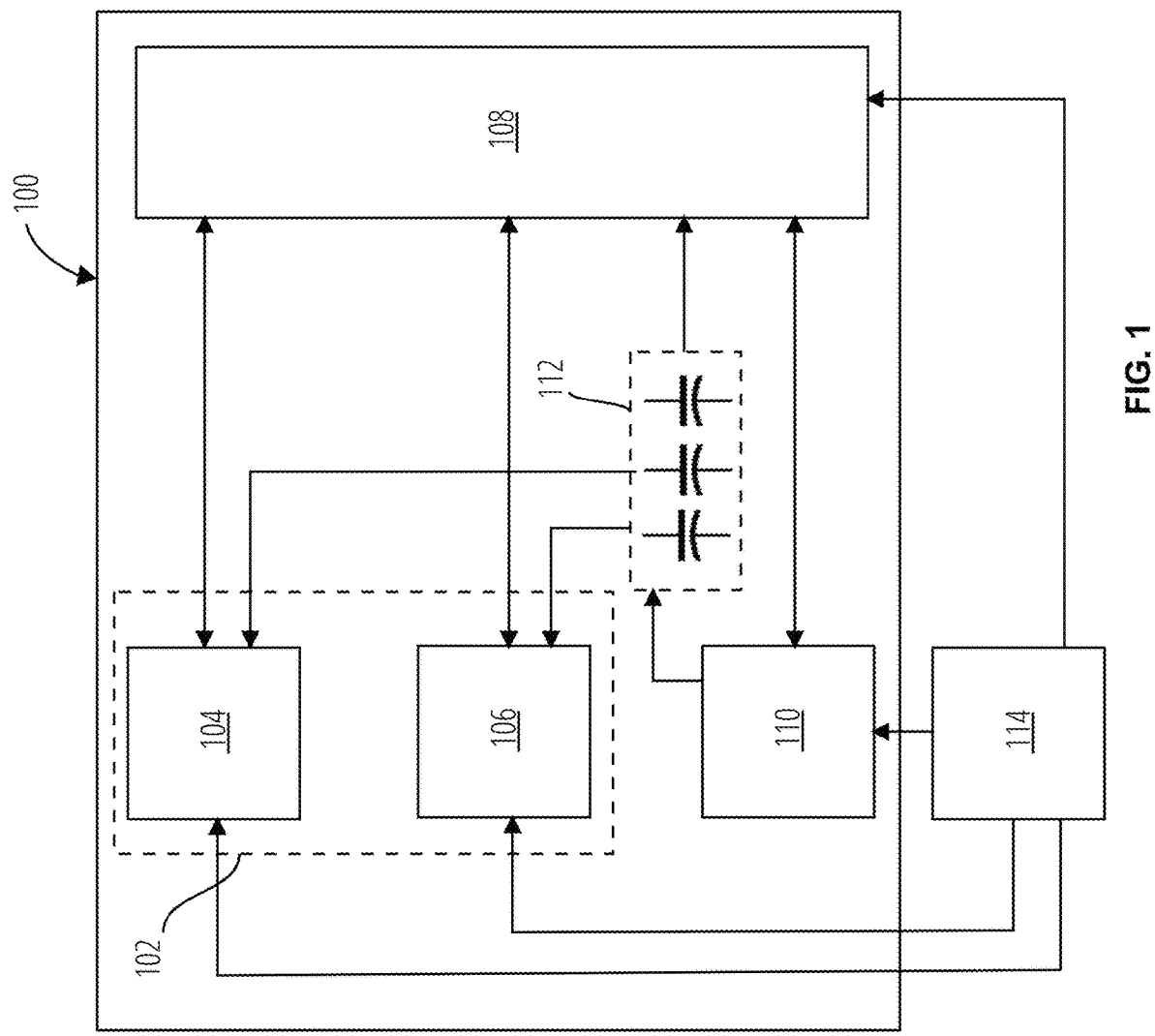
FIG. 1 illustrates a memory module 100 in accordance with one embodiment.

FIG. 1 illustrates a memory module 100 in one embodiment. The memory module 100 comprises a hybrid memory 102 comprising a volatile memory 104 and a non-volatile memory 106. The memory module 100 further comprises a controller 108, a power manager 110, and a capacitor power supply 112. The memory module 100 receives power via a host power supply 114.

The memory module 100 provides a low-cost, high density, non-volatile memory by using a low-cost volatile memory 104 (e.g., SRAM) in conjunction with a low-cost non-volatile memory 106 (e.g., FLASH). Other elements and/or couplings among the elements may be apparent to skilled practitioners in the relevant art(s). In addition to one or more capacitors, the capacitor power supply 112 may include one or more battery. The capacitors may be so-called "supercapacitors" such as lithium-ion capacitors and hybrid capacitors (capacitors having the slower energy release capability of a battery).

The volatile memory 104 may comprise an SDRAM (Synchronous Dynamic Random Access Memory). Other types of volatile random-access memory may also be used. The non-volatile memory 106 may comprise a NAND FLASH, and again, other types of nonvolatile memory may be used.

The power manager 110 interfaces the memory module 100 to an external energy source, for example the host power supply 114 of a larger system (a "host" system) that incorporates and uses the memory module 100 in modular form (e.g., DIMM pluggable form factor). For example, the host power supply 114 may be the power of a personal or business computer system that incorporates the memory module 100.

The power manager 110 also interfaces to the capacitor power supply 112. The capacitor power supply 112 may include one or more power capacitors and/or one or more batteries. The capacitor power supply 112 provides backup power to the memory module 100 for a temporary time when the host power supply 114 fails. The capacitor power supply 112 may provide power for long enough to copy data blocks from the volatile memory 104 to the non-volatile memory 106.

In the event of a host power supply 114 failure, the memory module 100 may operate as an isolated subsystem of the host device. The power manager 110 or controller 108 may detect that the host power supply 114 has failed. The controller 108 may then initiate backup of data currently stored in the volatile memory 104 into the non-volatile memory 106. Herein, the term "backup" means that data of the volatile memory 104 is stored into the non-volatile memory 106. Upon restoration of host device power, the controller 108 may initiate restoration of backed-up data from non-volatile memory 106 to the volatile memory 104. Herein, the term "restore" and "restoration" means that data of the non-volatile memory 106 is stored into the volatile memory 104.

The controller 108 may thus include logic to backup data from volatile memory 104 to non-volatile memory 106 when the host power supply 114 fails, and to restore data from non-volatile memory 106 to volatile memory 104 when the host device power becomes available again.

Note this does not mean that the memory module 100 necessarily operates on host device power when available. In some implementations, the memory module 100 may always operate on power supplied by the power manager 110, with the power manager 110 being replenished from the host device power while the host device power is operable.

Those skilled in the art will appreciate that various functional components, such as the power manager 110 and the controller 108, and even the volatile memory 104 and non-volatile memory 106, may in fact be implemented together as one or more integrated circuit devices (e.g., a System on a Chip), or packaged as one or more discrete physical components.

Data stored within the memory module 100 persists even when the power of the host device fails. The host device may interact with the memory module 100 as though interacting with volatile memory 104 (and, in some cases, the host device may "see" the volatile memory 104 as a different type of volatile memory technology than the volatile memory 104 actually is), even though, transparently, the data is stored internally by the memory module 100 in non-volatile memory 106 persistently in the absence of host device power.

The memory module 100 may write data to non-volatile memory 106 only in the event that host device power fails. Thus, the non-volatile memory 106 undergoes many fewer write cycles than would occur if it were being written every time data were written to the memory module 100 from the host device. When the non-volatile memory 106 is a low-cost, limited duty cycle NAND FLASH, the result in an extension of the useful lifetime of the non-volatile memory 106.

The controller 108 provides a memory interface to the host device. The memory interface may comprise a standard data and control interface for some particular kind of volatile memory. For example, the controller 108 may provide an SDRAM data, address, and control interface to the external system, even when the volatile memory 104 is not an SDRAM. The interface provided to the host device may or may not be the interface for the type of volatile memory actually used by the host device.

The controller 108 may additionally provide an interface whereby the host device may send commands to the memory module 100 to control the memory module 100 or obtain status. For example, in some embodiments the host device may command the memory module 100 to initiate a backup of data from volatile memory 104 to non-volatile memory 106, even though the host device power is still available. Additionally or alternatively, the memory module 100 or host device may provide a direct user interface, such as a switch or control on a graphic user interface, whereby a user of the host device may directly initiate a copy of data from volatile memory 104 to the non-volatile memory 106. Another action which may in some embodiments be initiated on the memory module 100 is restoring data from non-volatile memory 106 to the volatile memory 104. In some embodiments the host device may operate its system interface to the memory module 100 to initiate an in-system test of the memory module 100.

As previously described, the controller 108 may comprise logic to interface the volatile memory 104 to the host device, such as a personal computer system or a business computer system. Other examples of applications of the memory module 100 are embedded control applications, communications, and consumer products.

The controller 108 may present an interface to the host device, so that the volatile memory 104 is addressable for reading and writing of data by the host device.

Logic of the power manager 110 may detect when power from the host device fails. For example, the host device may suffer a power source outage or battery failure. When host device power fails, the power manager 110 may provide backup power to the volatile memory 104, non-volatile memory 106, and to the controller 108 for long enough to enable the backup of data from the volatile memory 104 to the non-volatile memory 106. The power manager 110 may act as the source of this backup power and as a conduit of power from the host device when the host device power is "on".

In some embodiments, the controller 108 may include logic to enable the host device to initiate a backup of data from the volatile memory 104 to the non-volatile memory 106, instead of waiting for a power failure to initiate the backup. The controller 108 may also comprise logic to emulate to the host device a type of volatile memory other than the actual type of the volatile memory. For example, internally the memory module 100 may employ SDRAM for the volatile memory 104. However, the controller 108 may include logic to emulate synchronous dynamic RAM (SDRAM), double data rate RAM (DDRAM), DDR2, asynchronous SRAM, C-F card, or PCI-Express (among other examples) to the host device.

Some or all of the components of the memory module 100 may implemented in various ways. For example, these components may be implemented as one of a multi-chip set, a board subsystem, or even a single chip.

Backups and restores of data may be implemented as data moves from the volatile memory 104 to the non-volatile memory 106, and vice versa, via the controller 108. In other embodiments, backups and restores may be implemented via data moves from the volatile memory 104 to the non-volatile memory 106 directly, without passing through the controller 108 and with the controller 108 operating as a coordinating controller of the data backup or restore.

Figure 2:
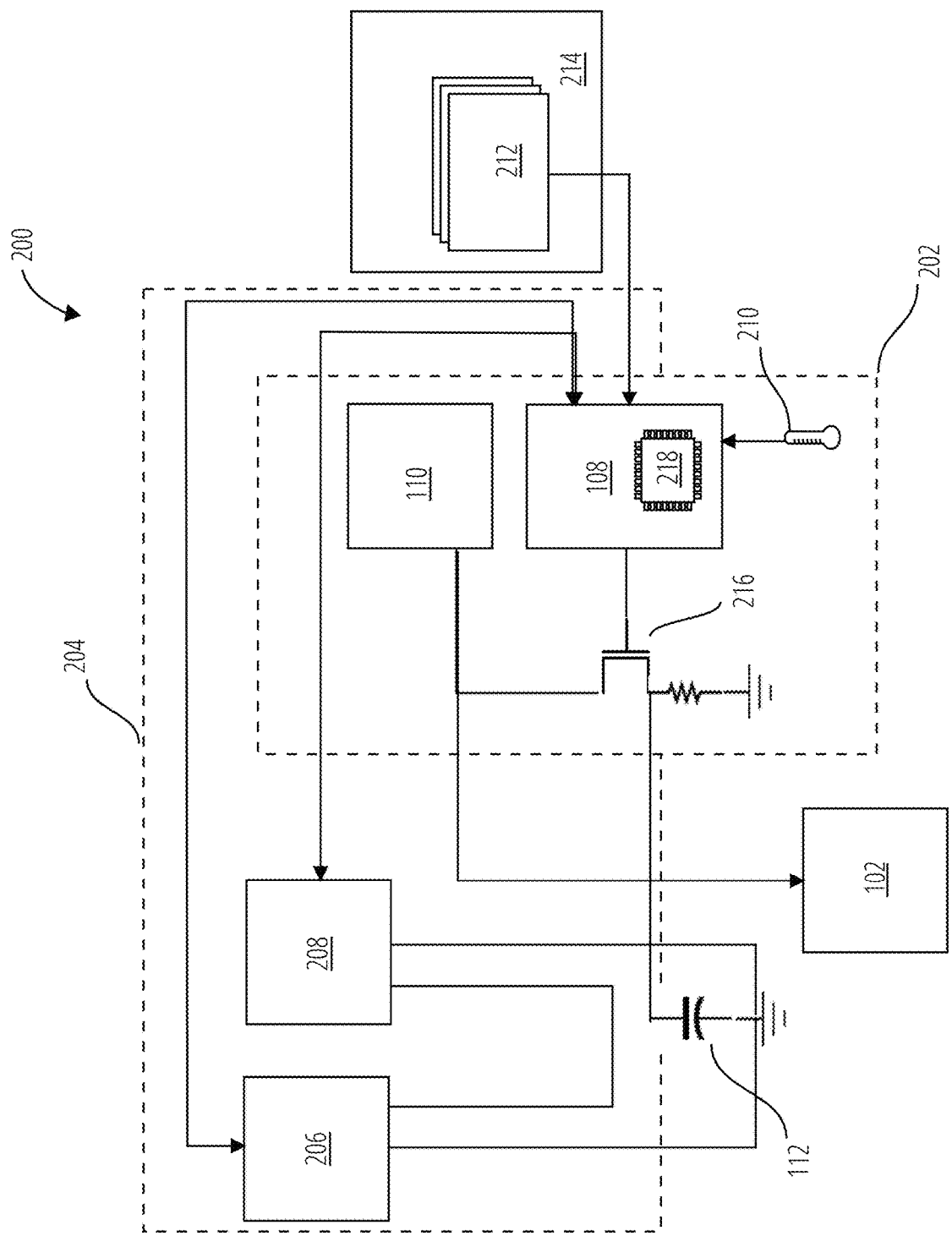
FIG. 2 illustrates an adaptive capacitor charge voltage management system 200 in accordance with one embodiment.

FIG. 2 illustrates an adaptive capacitor charge voltage management system 200 for the capacitor power supply 112 in one embodiment. The adaptive capacitor charge voltage management system 200 comprises a fast control loop 202 utilizing a thermal sensor 210, and a slow control loop 204 utilizing one or both of a capacitance measurement device 206 and an ESR measurement device 208. The controller 108 receives measures of capacitor operating temperature from the thermal sensor 210 via the fast control loop 202, and measures of capacitance and/or ESR from the capacitance measurement device 206 and ESR measurement device 208, via the slow control loop 204. The controller 108 utilizes the control structures 212 in the memory 214 to operate a switch 216 to charge one or more capacitor of the capacitor power supply 112 based on these measurements as applied to the control structures 212 (which may be memory tables or algorithms or both). The controller 108 further utilizes a clock 218 device (which may be internal to or external to the controller 108) to set the rates of the fast control loop 202 and the slow control loop 204. In some embodiments the control structures 212 may be located in the hybrid memory 102.

Figure 3:
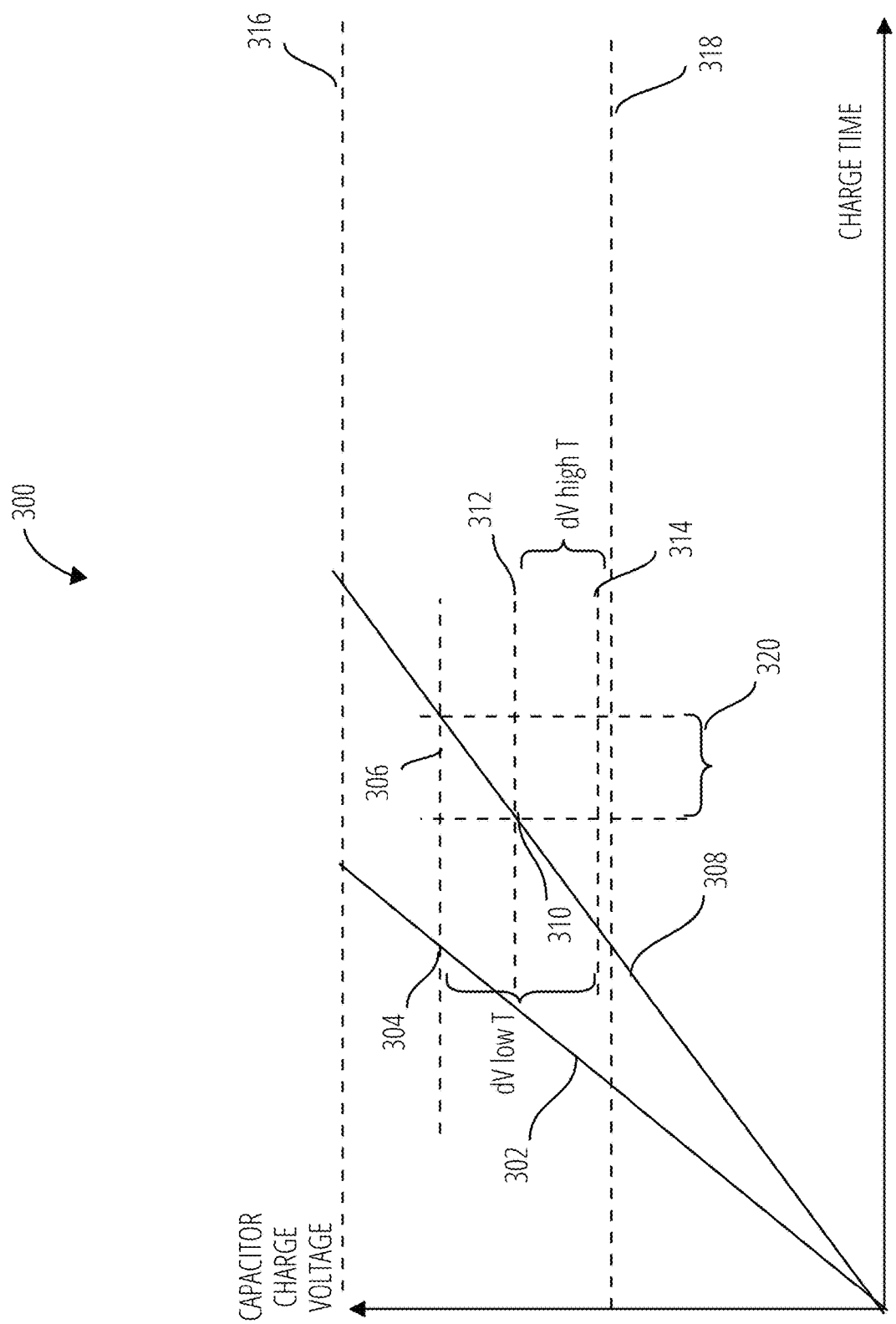
FIG. 3 illustrates a capacitor charge voltage profile 300 in accordance with one embodiment.

FIG. 3 illustrates a capacitor charge voltage profile 300 in one embodiment. The capacitor charge voltage profile 300 illustrates a low temperature capacitor charging ramp 302 to a low temperature enablement point 304 at a minimum low temperature safe enablement voltage 306, at which it is safe to use the capacitor as a power supply at the lower temperature for some device operation, such as a backup of data from a volatile memory to a non-volatile memory. The capacitor charge voltage profile 300 further illustrates a high temperature capacitor charging ramp 308 to a high temperature enablement point 310 at an adjusted minimum high temperature safe enablement voltage 312, at which it is safe to use the capacitor as a power supply at the higher temperature for some device operation.

In absence of a low temperature enablement point 304 or adjusted minimum high temperature safe enablement voltage 312, a compromised fixed enablement voltage (unadjusted absolute minimum capacitor charge voltage 318 or minimum low temperature safe enablement voltage 306) would be used. The fixed, unadjusted absolute minimum capacitor charge voltage 318 or minimum low temperature safe enablement voltage 306, being independent of temperature and age degradation, would compromise product life by either accelerating the aging of the capacitor by operating it at a higher voltage than needed for its temperature environment and energy storage capacity or reduce the product life prematurely by not having enough energy to prolong its function at end of life.

Figure 4:
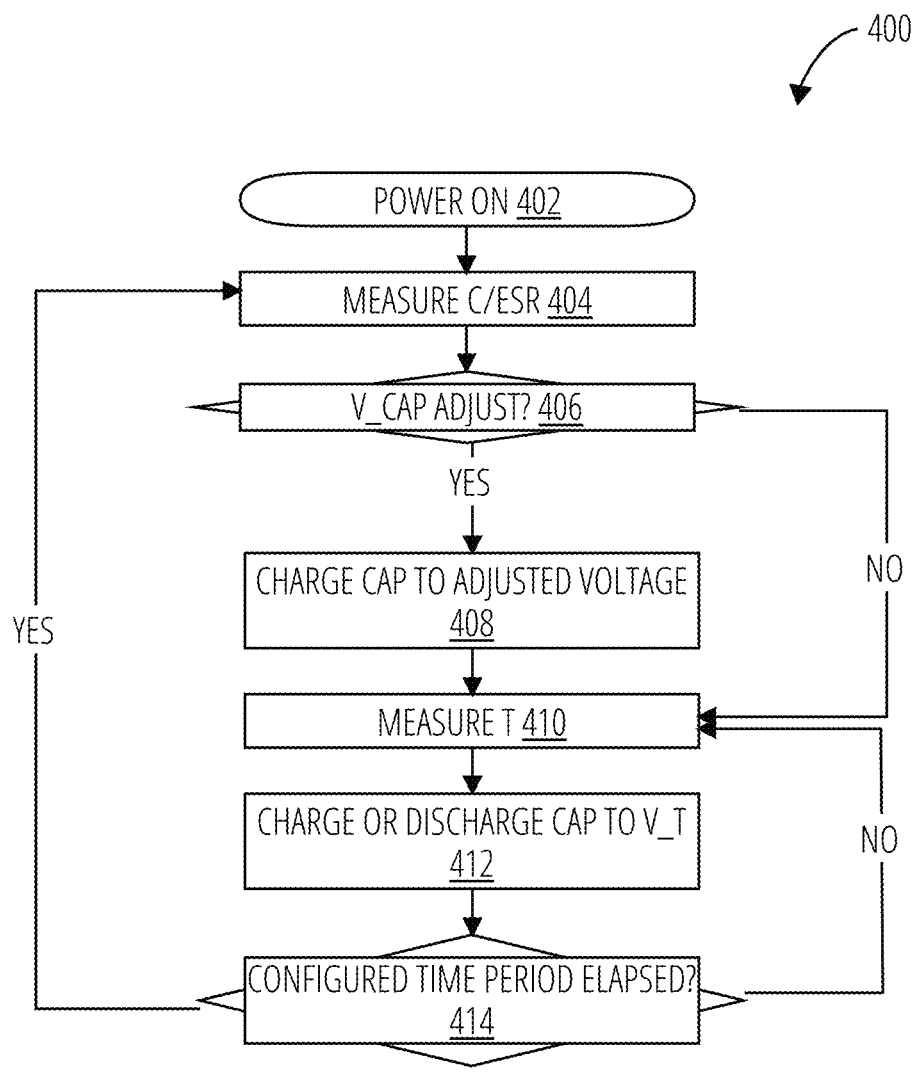
FIG. 4 illustrates an adaptive capacitor charge voltage management process 400 in accordance with one embodiment.

FIG. 4 illustrates an adaptive capacitor charge voltage management process 400 in one embodiment. At power on (start block 402) the capacitance and/or ESR of a capacitive power supply is measured (block 404). Based on this measurement (decision block 406), the capacitor charge voltage may be adjusted based on the capacitance-associative voltage control structure and/or the ESR-associative voltage control structure (block 408), after which the capacitor operating temperature is measured (block 410) and the capacitor charge voltage is further increased or decreased based on the temperature, and also in some embodiments further based on the capacitor operational age, based on the temperature-associative voltage control structure. If a configured time interval for a slow control loop (slower response time than the fast control loop) of the capacitor charge voltage has elapsed (decision block 414), or in response to a host command, the adaptive capacitor charge voltage management process 400 repeats at block 404 with another measure of the capacitance and/or ESR. Otherwise the fast control loop is engaged to repeat the measurement of the capacitor operating temperature at block 410 (also typically after some configured time interval that is shorter, e.g. by a factor of at least 10, than the configured time interval for engaging the slow control loop).

FIG. 5 illustrates a temperature-associative voltage control structure 500 for setting a capacitor charge voltage in one embodiment. The temperature-associative voltage control structure 500 is illustrated in a memory structure tabular format but may in some embodiments be implemented by logic (e.g., machine instructions) executing an algorithm. The temperature-associative voltage control structure 500 comprises adapted capacitor charge voltage settings based on the age of the capacitor (as proxied by the measure of capacitance in the slow control loop) and temperature zones.

FIG. 6 illustrates a temperature-associative voltage control structure 600 for setting the capacitor upper charge voltage in one embodiment. The temperature-associative voltage control structure 600 comprises adapted capacitor charge voltage settings based on the age of the capacitor (as proxied by the measure of equivalent series resistance in the slow control loop) and temperature zones. Thus in addition to the fast control loop to set the capacitor charge voltage based on temperature zones, the slow control loop is engaged set the capacitor charge voltage based on one or both of capacitance and equivalent series resistance, which may proxy the capacitor operational age. The temperature-associative voltage control structure 500 may be partitioned into temperature zones, with adjustments to the capacitor charge voltage only made across and not within the temperature zones.

What is claimed is:

1. An apparatus comprising:
   a capacitive power supply;
   a voltage adjustment circuit for setting a capacitor charge voltage of the capacitive power supply;
   a capacitance or equivalent series resistance (ESR) measurement component for the capacitive power supply;
   a temperature sensor;
   a controller to operate the capacitive or ESR measurement component on a slow control loop to set the capacitor charge voltage; and
   the controller to operate the temperature sensor on a fast control loop to set the capacitor charge voltage.

2. The apparatus of claim 1, wherein the capacitive power supply includes at least one lithium-ion capacitor.

3. The apparatus of claim 1, wherein the capacitive power supply includes at least one hybrid capacitor.

4. The apparatus of claim 1, wherein the capacitive power supply includes at least one battery.

5. The apparatus of claim 1, further comprising a hybrid memory, wherein the hybrid memory includes a volatile memory and a non-volatile memory.

6. The apparatus of claim 5, wherein the capacitive power supply is configured to provide operation power to the hybrid memory such that data in the volatile memory is copied to the non-volatile memory during power supply failure of the apparatus.

7. The apparatus of claim 1, further comprising a power switch disposed between a power supply and the capacitive power supply, wherein the power switch is controlled by the voltage adjustment circuit.

8. The apparatus of claim 7, further comprising a control structure having at least one of memory tables and algorithms, wherein the voltage adjustment circuit utilizes the control structure to adjust operation of the power switch.

9. The apparatus of claim 7, wherein the power supply is configured to charge the capacitive power supply.

10. The apparatus of claim 1, further comprising a clock device configured to set rates of the fast and slow control loops.

* * * * *